United States Patent [19]

Curreri et al.

[11] Patent Number: 4,952,780
[45] Date of Patent: Aug. 28, 1990

[54] COMPUTERIZED MULTI-ZONE CRYSTAL GROWTH FURNACE

[75] Inventors: Victor Curreri, Setauket; John F. Klein, Port Washington; Janine E. Dubois, Shirley; David J. Larson, Sr., Huntington Station, all of N.Y.

[73] Assignee: Grumman Aerospace Corporation, Bethpage, N.Y.

[21] Appl. No.: 264,378

[22] Filed: Oct. 31, 1988

[51] Int. Cl.⁵ .............................. F27B 5/14; H05B 1/02
[52] U.S. Cl. .................................... 219/390; 219/494; 219/413
[58] Field of Search ............... 219/390, 502, 494, 492, 219/412, 413; 373/136

[56] References Cited

U.S. PATENT DOCUMENTS

| | | | |
|---|---|---|---|
| 3,161,759 | 12/1964 | Gambill | 219/502 |
| 3,274,375 | 9/1966 | Beltz | 219/502 |
| 3,291,969 | 12/1966 | Speransky | 373/136 |
| 3,370,120 | 2/1968 | Lasch | 373/136 |
| 3,385,921 | 5/1968 | Hampton | 219/390 |
| 3,453,450 | 7/1969 | Evalds | 219/502 |
| 4,167,663 | 9/1979 | Granzow | 219/502 |
| 4,522,025 | 10/1985 | Aldrich | 219/390 |
| 4,603,730 | 8/1986 | Davis | 373/136 |
| 4,711,989 | 12/1987 | Yu | 219/411 |

Primary Examiner—Teresa J. Walberg
Attorney, Agent, or Firm—Richard G. Geib; Daniel J. Tick; Bernard S. Huffman

[57] ABSTRACT

A heating system has a substantially cylindrical hollow muffle formed of a alumina ceramic with a plurality of heat-generating windings therearound. A light-actuated power control is operatively connected to the windings. A computer is operatively connected to a temperature monitor associated with an article being heated in the muffle. The computer is also operatively connected to a light-signal generator and provides commands to the generator in the form of a train of equidistantly spaced electrical pulses in response to temperature measurements provided by the monitor such that an article can be heated to an elevated steady state temperature and controlled at that steady state temperature within precise predetermined limits. The precise temperature control makes the system particularly valuable in the fabrication of crystals with uniform properties or having special growth requirements.

42 Claims, 3 Drawing Sheets

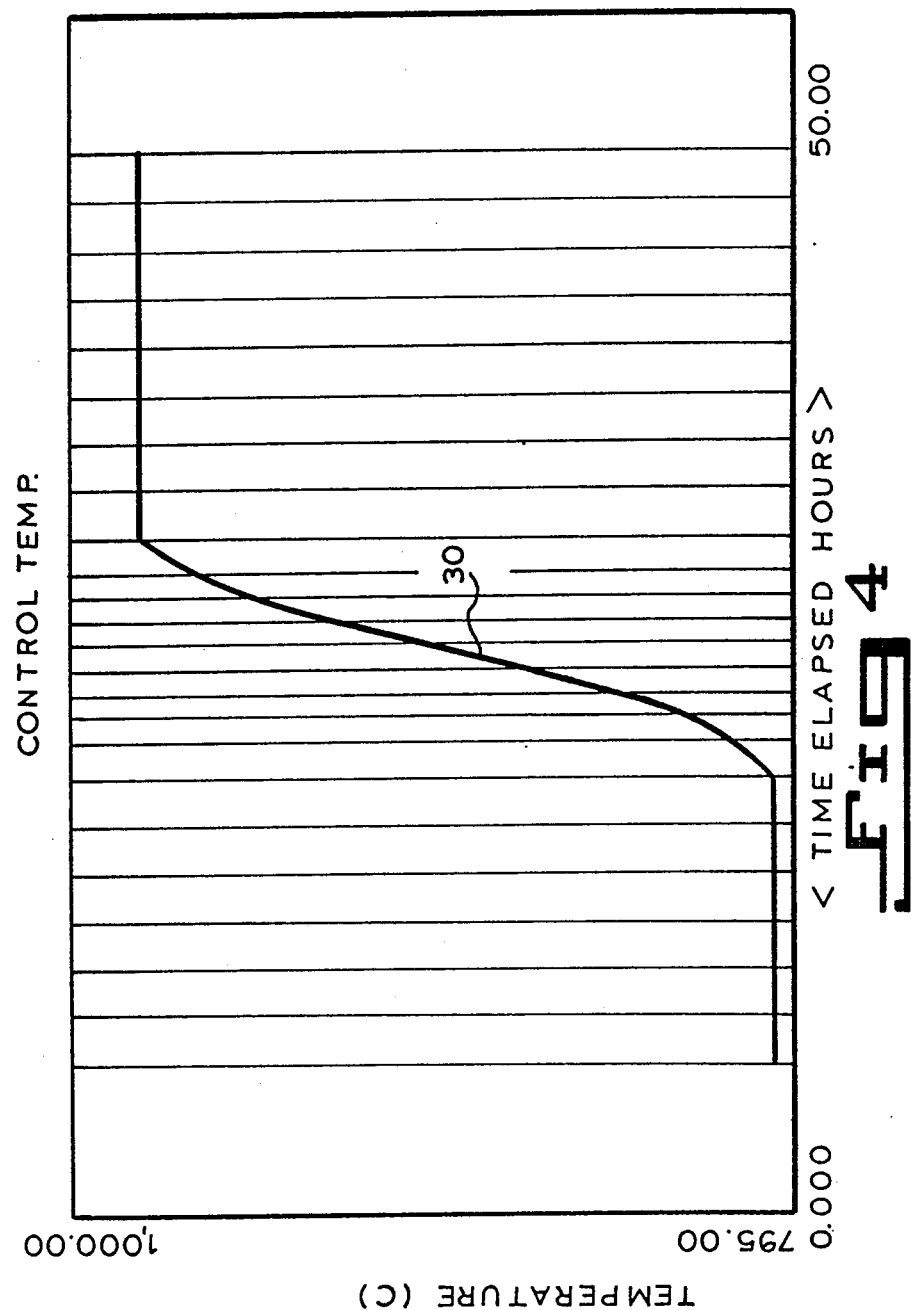

COMPUTERIZED MULTI-ZONE CRYSTAL GROWTH FURNACE

FIELD OF THE INVENTION

The invention relates to a computer controlled furnace for heating articles, and more particularly to a digital furnace system that precisely controls temperatures and heating, and wherein temperatures and heating can be maintained, adjusted, monitored and displayed in real time. The furnace has particular application for the growth and fabrication of crystals.

BACKGROUND OF THE INVENTION

Although computers can rapidly process and respond to received data, it is not always possible for certain systems to take advantage of the computer speed. This is particularly true where peripheral devices have very slow response times, or where a system has inherent inertia.

Furnaces and ovens for heating articles at elevated temperatures are generally not precise, nor quick to respond to temperature changes. Furnace systems generally have a high degree of inertia, wherein the heating elements and temperature monitors respond very slowly to external commands. Heating systems, therefore, tend to be difficult to control, and temperature requirements can rarely be held to exacting tolerances.

In recent years, the need to control furnace temperatures to precise and demanding tolerances has become more critical, particularly in the manufacture of semiconductors and detector materials. Such materials generally require prolonged cycles of heating or cooling at precisely held temperatures or temperature gradients, in order that homogeneous, low-defect crystals can be achieved.

The heating and temperature control system of this invention was conceived having as one of its purposes the growth of cadmium telluride and gallium arsenide crystals having uniform properties. One of the heating requirements for obtaining uniform growth for these crystals is the maintenance of precise temperature and temperature gradients, at close tolerance over an extended period of time during the growth process.

The furnace system of this invention has been designed to be responsive both quickly and accurately to the commands of a computer.

The furnace system of the invention is capable of maintaining and controlling temperatures to precise tolerances, formerly unachievable in the art.

BRIEF DESCRIPTION OF RELATED ART

A gradient-type furnace for growing crystals, similar to the furnace system of this invention is illustrated in U.S. Pat. No. 4,086,424, issued Apr. 25, 1978.

In the patented furnace, a temperature profile having twenty-one zones is achieved by sequentially powering the heating elements in each zone. While this furnace illustrates the basic concept of a multizone crystal growth furnace, it cannot achieve the necessary temperature accuracy and precision required to provide the character of a gallium arsenide crystal.

For high quality crystals having process reliability, the gallium arsenide crystal must be held to a temperature of extreme precision during the crystal growth process.

One approach to uniform GaAs growth controls arsenic vapour pressure during growth, for example, a temperature of 617° C. ±0.1° C. can be used for uniform vapour pressure growth.

The ±0.1 degree tolerance at 617° C. represents a precision of approximately 0.02%.

The aforementioned patented furnace provides no teaching how such an extreme temperature tolerance can be achieved.

The present invention through the use of a computer has developed a system which is capable of achieving the precision required to grow crystals and other high temperature materials.

RELATED APPLICATION

A crystal growth furnace of similar design and construction to the present invention is disclosed in U.S. Patent Application Ser. No. 132,224, filed Dec. 14, 1987. Teachings of mutually shared furnace construction and design are meant to be incorporated herein by way of reference.

BRIEF SUMMARY OF THE INVENTION

The invention features a computerized furnace system and method for digitally controlling a temperature profile of a heated article to within precise given limits.

The furnace system comprises a computer which calculates a heat cycle for each heating element in the furnace. There are twenty-four zones in the muffle of the furnace which a crystal material to be heated traverses. A heating element in each zone receives power in the form of a train of electrical pulses which are equidistantly spaced in time in accordance with a calculated heating cycle. Depending upon the deviation from a desired temperature, the train of pulses can vary anywhere from zero to 100 pulses per 100 milliseconds. It is this minute incremental supply of power which provides the precision in the control of a given temperature.

Of course, a major factor in providing such exacting control is being able to quickly and accurately monitor the temperature profile of the heated articles. The temperature information is then fed back to the computer which uses a weighted, continuously up-dated average of each temperature value to calculate the instantaneous heat cycle for each zone.

The heat cycle is calculated from a group of algorithmic equations.

The temperature of each zone can be held to a precision of between ±0.1° and ±0.5° C. in a temperature range of approximately 400° C. to 1,350° C., and ±0.1° C. in a temperature range of between 500° C. to 800° C.

One of the reasons that the furnace system was developed, was the need for a heating system of the invention for growing crystals of gallium arsenide. In the process of forming the gallium arsenide crystal, there is a critical requirement for holding an arsenic zone temperature of 617° C. to a precision of ±0.1° C. for several hours. This type of precision was not available with present-day commercial systems. The furnace has a power efficiency of about 95% or better by transmitting power using direct current through switching transitors. Similar systems may only be 50 to 70% efficient.

It is an object of the invention to provide an improved furnace system and method for digitally controlling the temperature of a heated article to a precise tolerance.

It is another object of this invention to provide a computerized furnace system wherein the temperature of a heated article is precisely controlled by feeding power to heating elements of the furnace in a train of electrical pulses equidistantly spaced in time.

These and other objects of the invention will become more apparent and will be better understood with reference to the subsequent detailed description considered in conjunction with the accompanying drawings.

BRIEF DESCRIPTION OF THE DRAWINGS

In order that the invention may be readily carried into effect, it will now be described with reference to the accompanying drawings, wherein:

FIG. 4 is a typical temperature profile of the twenty-four temperature zones of the muffle illustrated in FIG. 3.

DETAILED DESCRIPTION OF A PREFERRED EMBODIMENT

Figure 1:
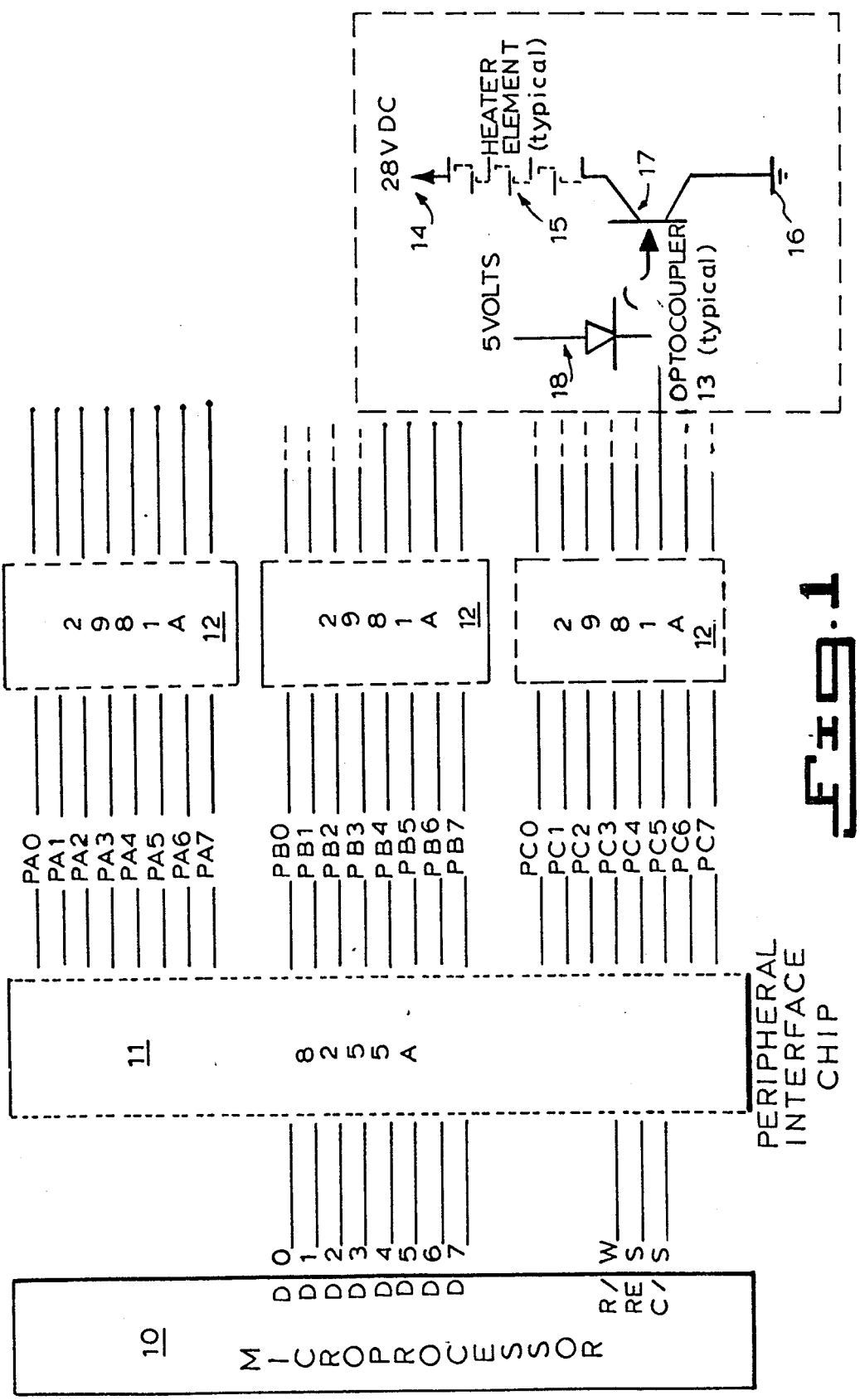
FIG. 1 is a schematic diagram of the furnace system of the invention.

Generally speaking, the invention pertains to a computerized furnace system and method for precisely controlling the temperature of a heated article. The invention system accomplishes its precise control by feeding power to heat the heating elements of the furnace in a train of equidistantly spaced pulses of a minute power increment. The required amount of power is determined from algorithmic equations utilizing monitored temperature readings which are continuously updated.

There are twenty-four zones in the furnace. This provides unique flexibility and contributes to achieving precise control and dynamic response. Some zones are 2 inches long, while others are 1 inch long. Zone lengths and number could be adjusted for different furnace sizes and profiles. The large number of zones allows the temperature profile to be set precisely and held stable during the processing of the material. This ability to set a profile and maintain stability are a significant advance in the state of the art in crystal growth processing.

The present system is designed from commercially available components, which are identified by the same reference numerals in the FIGS.

FIG. 1 is a schematic diagram of the system of the invention. In the system of FIG. 1, a microprocessor 10 issues a plurality of commands through its output (D0 through D7) to a peripheral interface chip 11, which combines with three buffer chips 12 to feed twenty-four heating zones with a train of digital pulses. Twenty-four optical couplers 13 (typical) are electrically connected to the twenty four outputs of the three buffers 12 and isolate the furnace power source 14 from the microprocessor 10.

Each optical coupler 13 comprises a light-emitting diode 18 and photosensitive transistor coupled to a power switching transistor 17. Each transistor 17 acts in the capacity of a switch, passing power from power source 14 through each heating element 15 (typical) to ground 16, in response to light emitted by its respective LED 18.

The optical couplers 13 provide total electrical isolation between the computer and the power source.

In addition, the digital switching technique provides efficient power transfer to the heating elements.

Figure 3:
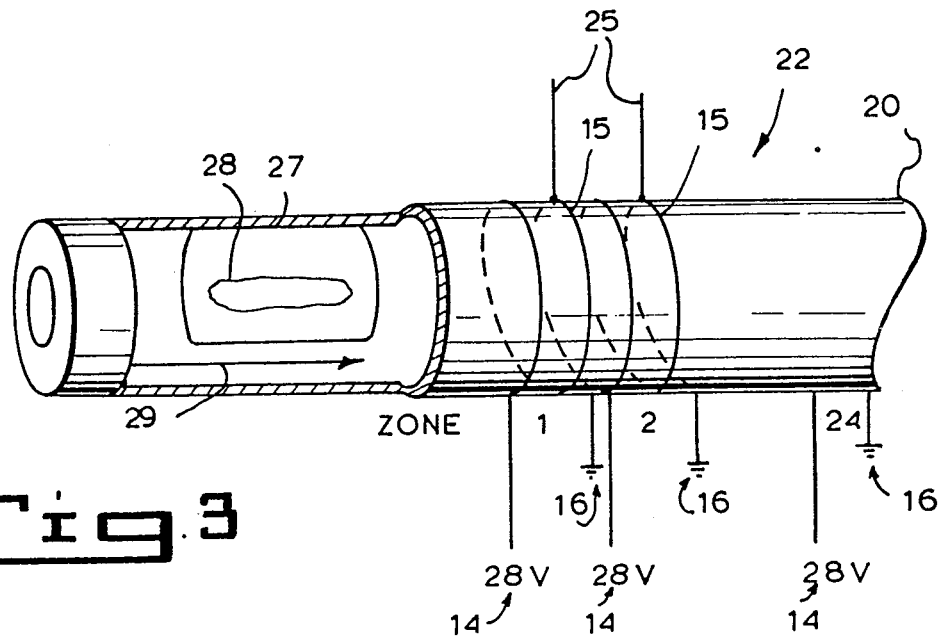
FIG. 3 is a partially cut-away perspective view of a crystal material passing through the muffle of the furnace system of the invention depicted in FIG. 1.

There is a heating element 15 for each heating zone (1 through 24) of the muffle 20 of the furnace (arrow 22), as illustrated in FIG. 3. For purposes of brevity, furnace construction is described in more detail in the aforementioned U.S. patent application Ser. No. 132,224.

Each heating element 15 is helically wound directly upon and about the muffle 20 and preferably comprises a plurality of turns. This results in a tight coupling of the power input to the physical response of the muffle 20. The muffle 20 is a castable alumina cylinder about ⅛ inch thick having an internal diameter of 0.5 to 10.0 inches and a length of 10 to 190 inches. Preferably, the muffle has a 2.5 inch inner diameter and a 2.75 inch outer diameter, and is approximately 48 inches long. The windings 15 are a platinum/rhodium alloy of 20% rhodium of about 18 or 19 gauge wire. The wound muffle is insulated to retain the heat.

The muffle 20 is anchored at one end as a reference for thermal expansion.

There are several layers of high temperature insulation surrounding the muffle 20. The layer closest to the muffle is zircar felt paper. Proceeding concentrically or radially outward, the materials are: safil blanket, 2600° F. vacuum formed ceramic fiber board and 2300° F. ceramic fiber blanket.

A liquid-cooled outer shell surrounds the furnace insulation. Aluminum is used for the shell material in the current design. Other materials could also be used. Active cooling of the shell also contributes to the furnace stability and response.

Thermal profile capability can be tailored using shunt disks to increase the removal of heat from the furnace.

The windings 15 are encased by a high purity castable alumina ceramic. Castable ceramic thickness can be between 0.060 and 0.500 inches and is preferably about 0.170-inch, except in the regions supporting power leads and thermocouples. The castable ceramic extends about 1.5 inches beyond the end of the windings 15.

The radial portion of the power leads (not shown in the FIGS.) are triple twisted. The triple twisted leads are encased in segmented one hole ceramic tubing as they traverse radially inward from power connectors. Segmented ceramic tubes are used to provide both high temperature insulation and flexibility of the leads. Slack is allowed in the leads to accommodate motion due to the expansion of the muffle 20 as its temperature is raised. A two hole ceramic is used where the two leads enter the castable ceramic layer. Lead separation and mechanical support are provided by the two hole ceramic. Triple twist lead wire is encased directly into the castable ceramic after passing through the two hole ceramic. Loads on the leads are on triple wire rather than a single wire. Half round ceramics are used to locally cover the winding power leads from adjacent zones where they start to run radially outward. These ceramics insulate adjacent zones from each other.

Additional castable ceramic is built up to support the power leads and two hole ceramics. A trapezoidal cross-sectional region (not shown in the FIGS.) running the length of the muffle 20 results. This region is about 0.5 inch wide at its outer edge.

A thermocouple 25 (typical) is associated with each zone (1 through 24) to measure the instantaneous temperature to provide a real time temperature profile 30 of the furnace system, as shown in FIG. 3. The profile 30, illustrated in FIG. 4, is continuously updated, by dropping one of a group of readings, every time a new temperature is obtained.

All 24 zones are interrogated in 2.4 seconds. The thermocouples 25 are each interrogated sequentially, by the microprocessor 10 on the average of once every 100 milliseconds, and a weighted average can be obtained in accordance with the first algorithmic equation shown in Table I, below:

TABLE I

PID EQUATIONS

| | |
|---|---|
| Weighted average | a = c/n + ((1 − 1/n) * oa) |
| Derivative | d = (a − oa)/t |
| Error | e = s − a − (kd * d) |
| Integral | i = ((e + oe)/2 * t) + oi |
| Proportional power | p = (e * kp) + (i * ki) |
| Percent duty cycle | dy = p * ks |

Key to Variable Names
a = weighted average
c = control TC reading
d = derivative
dy = % duty cycle
e = error
i = integral
kd = derivative constant
ki = integral constant
kp = power constant
ks = scaling constant
n = number of terms in weighted average (smoothing)
p = proportional power
s = setpoint
t = interval time between previous reading and current reading
oa = previous weighted average
oe = previous error
oi = previous integral Thermocouples 25 for each zone are located equidistantly from the ends of each of the windings 15. They are positioned to avoid potential contact with the windings 15, if the castable ceramic cracks. Thermocouples 25 are located between 0.03 to 0.375 inch radially outward from the outer surfaces of the winding and preferably about 0.170 inches. They are held in place by a fixture while the castable ceramic is applied and for the curing of the castable ceramic. The thermocouple leads are encased in segmented ceramic tubing to provide flexibility for thermal expansion of the muffle. Slack is provided in the leads. The last ceramic segment is supported by a castable ceramic build-up similar to that used for the power leads.

Some of the system constants or scaling factors are obtained on a test basis after the system is built.

Each zone can be heated or cooled to a given temperature according to a predetermined menu or heat ramping procedure, which can be stored in a memory (not shown in the FIGS.). Such a procedure can be derived by making a few test runs.

The microprocessor 10 will calculate from the weighted averages for each zone a power input or duty cycle corresponding to the additional heat required to control or maintain a given zone temperature, in accordance with the last algorithmic equation of Table I.

Figure 2:
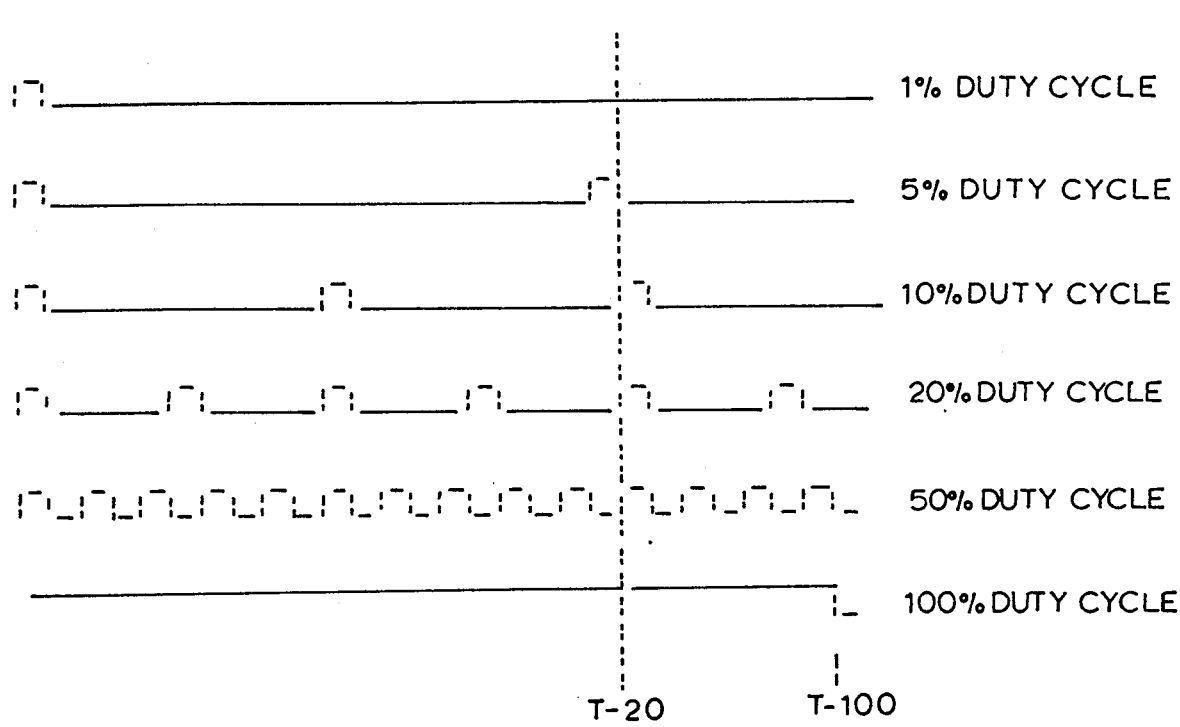
FIG. 2 is a diagrammatic view of the pulsed wave forms generated by the microprocessor shown in FIG. 1.

The power input for heat control can range anywhere from 0% to 100% of full power, as shown in FIG. 2.

A 1% duty cycle, for example, will provide just one power pulse per 100 milliseconds to a respective heating element 15, while a 20% duty cycle will provide twenty equidistantly spaced pulses in time per 100 milliseconds.

It is this minutely incremental and instantaneous feeding of power which provides the unique temperature control of the system. Of course, the switching transistors 17, must be able to respond within the duty cycle pulse rate set for the system. Each transistor 17 of this invention has a response time of approximately 50 μs. Each pulse supplies between 20 and 810 watts per millisecond.

It is also contemplated, that the duty cycle can be more finely incremented by providing a duty cycle with a one thousand pulse per 100 millisecond rate, if so desired.

With respect to the temperature monitoring, the thermocouples 25 must not only be as accurate or precise as the tolerance to which the temperature of each zone is to be controlled, but they must also have a response time which falls within the interrogation cycle.

The cycle time for each zone takes about 160 milliseconds to interrogate. As part of each interrogation cycle, the percent duty for each zone is updated. Several zones are interrogated in parallel. The effective average cycle time is about 100 milliseconds. The 24 zones are interrogated sequentially. All the zones are interrogated and updated about every 2.4 seconds.

All thermocouple outputs will be boosted through a calibrated amplifier. The amplified outputs will then be inputted to the microprocessor 10 through 14 or 16 bit analog-to-digital converters (not shown in the FIGS.). In accordance with the invention, these combined circuits will provide a measurement precision for each thermocouple of + or −0.005% (or 5 parts in one hundred thousand). The thermocouples 25 are controllable by the furnace of the invention to a precision of + or −0.005% (or 5 parts in one hundred thousands).

The thermocouples 25 are provided by Grumman Aerospace Corporation.

The process for fabricating a gallium arsenide crystal starts with an ampoule 27 about 6 inches long containing a raw gallium arsenide ingot 28, shown in FIG. 3. The ampoule 27 is fed (arrow 29) into muffle 20 and then exposed to a sequence of carefully controlled temperature changes. The first change applies melting temperature to the ampoule (high temperature). The second change allows cooling from the high temperature to the low temperature (adiabatic). The third change applies low temperature or freeze temperature to the ampoule. The fourth change controls its curing to room temperature. Table II shows the temperatures and tolerances required:

TABLE II

TEMPERATURE ZONES

| | |
|---|---|
| High Temp. | About 1250° C. ± 1° C. for 10 hrs. |
| Adiabatic Zone | Cools from 1250° C. to 1150° C. for 50 hrs. |
| Low Temp. | About 1150 degrees centigrade ± 1 degree for 10 hrs. |

The ampoule 27 with its GaAs ingot 28 can be mechanically moved through the system, or the system can provide relative movement of temperatures electronically.

The entire process takes about 80 hours, in which time the ampoule 27 and ingot 28 move about 7 to 8 inches. Table III below shows the oven temperature gradients. The ampoule 27 must pass through from left to right. The first is the melt zone where the GaAs raw material 28 is heated to a melt. The second is the adiabatic zone where the melted material slowly cools from 1250° C. to 1150° C. and the crystal is formed. The third is the freeze zone where the crystal becomes stable and solid. The fourth is the arsenic zone where gas is released from the arsenic and absorbed by the forming material.

TABLE III

| 1250 Deg. C. <Melt Zone> | Natural Cooling <Adiabatic Zone> Natural Cool from 1250 to 1150 → | 1150 Deg. C. <Freeze Zone> Heat Out of Ampule | Natural Cooling <Cooling Zone> | 617 Deg. C. <Arsenic Zone> |
|---|---|---|---|---|
| 1st Stage Melt | 2nd Stage Gradual Cooling → → | 3rd Stage Freeze | Ramp Down to Room Temperature | |
| Heat Into Ampule | | | | |

Naturally, it is to be understood that other crystal fabrications will require a different temperature gradient and sequence.

The GaAs crystal fabrication described herein is meant to be a teaching of one such crystal that can be fabricated with the invention.

Having thus described the invention, what is desired to be protected by Letters Patent is presented by the subsequently appended claims.

We claim:

1. A temperature control system for heating an article at an elevated steady state temperature and controlling said steady state temperature within precise, given limits, said system comprising
    heating means for receiving power to heat an article, said heating means comprising a substantially cylindrical hollow muffle formed of alumina ceramic in which the article to be heated is disposed, a number of heat generating windings wound upon the muffle, said windings being thermally coupled to said muffle to provide a quick heating response to power received by said heating means;
    light-actuated power control means connected to said heating means for passing power to said heating means in response to a light signal;
    light signal generating means for generating a light signal to actuate said power control means;
    a source of power connected to said power control means for providing power to said heating means when said power control means is actuated;
    temperature monitoring means associated with said article being heated for measuring the temperature of said article; and
    computer means operatively connected to said light signal generating means and said temperature monitoring means for providing commands to said light signal generating means in the form of a train of equidistantly spaced electrical pulses in response to a temperature measurement provided by said monitoring means, said temperature monitoring means comprising a plurality of thermocouples, at least one thermocouple for each said heating zone, each of said thermocouples being disposed approximately 0.03 to 0.375 inch radially outward from an outer surface of its respective winding.

2. The temperature control system of claim 1, wherein said windings are helically wound on said muffle and each of said windings defines a respective heating zone of a heating profile.

3. The temperature control system of claim 2, wherein each thermocouple is disposed approximately in a mid-portion of the length of its respective winding.

4. The temperature control system of claim 3, further comprising amplifying and digitizing means for amplifying and digitizing the output of each of said thermocouples prior to transmittal to said computer means.

5. The temperature control system of claim 4, wherein each of said thermocouples has leads encased in segmented ceramic tubing to provide flexibility for thermal expansion of said muffle.

6. The temperature control system of claim 1, further comprising layers of insulation surrounding said muffle.

7. The temperature control system of claim 6, wherein said layers of insulation comprise materials selected from a group consisting of a zircar felt paper; a safil blanket; ceramic fiber board and ceramic fiber blanket.

8. The temperature control system of claim 7, further comprising a liquid cooled outer shell surrounding said insulation layers.

9. The temperature control system of claim 1, wherein said windings are each encased in a castable alumina ceramic.

10. The temperature control system of claim 1, wherein said internal diameter of said muffle is approximately 2.5 inches and said muffle has an external diameter approximately 2.75 inches.

11. A temperature control system as claimed in claim 1, wherein said muffle has an internal diameter of 0.5 to 10.0 inches and a thickness of approximately 0.060 to 0.500 inch and wherein said electrical pulses range from at least zero to 100 pulses per 100 milliseconds.

12. A computerized temperature control system comprising
    a computer for calculating a heat cycle and issuing a series of command signals to a power supply in the form of equidistantly spaced electrical pulses in response to an incremental temperature measurement;
    a substantially cylindrical hollow muffle;
    a plurality of heating windings for heating an article at an elevated temperature, said heating windings being wound on said muffle, each winding defining a heating zone, and a number of zones forming a heating profile for an article being heated, said windings being thermally coupled to said muffle to provide a quick heating response to power received by said heating windings;
    a power supply operatively connected to said heating windings for supplying a series of power pulses thereto in response to command signals from said computer;
    isolation means for electrically isolating said computer from said power supply; and
    temperature monitoring means operatively connected to said computer and disposed adjacent said article for obtaining temperature measurements from said heated article, said computer being operative to incrementally interrogate said temperature monitoring means, and in response to a temperature measurement signal, calculate a duty cycle comprising a series of command pulses for actuating said power supply, said temperature monitoring means comprising a plurality of thermocouples, at least one thermocouple for each said heating zone, each of said thermocouples being disposed approximately 0.03 to 0.375 inch radially outward from an outer surface of its respective winding.

13. The computerized temperature control system of claim 12, wherein each thermocouple is disposed approximately in a mid-portion of the length of its respective winding.

14. The computerized temperature control system of claim 13, further comprising amplifying and digitizing means for amplifying and digitizing the output of each of said thermocouples prior to transmittal to said computer means.

15. The computerized temperature control system of claim 14, wherein each of said thermocouples has leads encased in segmented ceramic tubing to provide flexibility for thermal expansion of said muffle.

16. The computerized temperature control system of claim 12, further comprising layers of insulation surrounding said muffle.

17. The computerized temperature control system of claim 16, wherein said layers of insulation comprise materials selected from a group consisting of a zircar felt paper; a safil blanket; ceramic fiber board and ceramic fiber blanket.

18. The computerized temperature control system of claim 17, further comprising a liquid cooled outer shell surrounding said insulation layers.

19. The computerized temperature control system of claim 12, wherein each of said heating element windings is encased in a castable alumina ceramic.

20. The computerized temperature control system of claim 12, wherein said muffle has an internal diameter of approximately 2.5 inches and said muffle has an external diameter of approximately 2.75 inches.

21. The computerized temperature control system of claim 20, wherein said muffle has spaced opposite ends and is anchored at one end as a reference for thermal expansion.

22. A computerized temperature control system as claimed in claim 12, wherein said electrical pulses range from at least zero to 100 pulses per 100 milliseconds and wherein said muffle is formed of alumina ceramic in which the article to be heated is disposed, said muffle having an internal diameter in a range of 0.5 to 10 inches and a thickness of approximately 0.060 to 0.500 inch.

23. A heating system for heating an article at an elevated steady state temperature and controlling said steady state temperature within precise, given limits, said heating system comprising
heating means for receiving power to heat an article;
light-actuated power control means connected to said heating means for passing power to said heating means in response to a light signal;
light signal generating means for generating a light signal to actuate said power control means;
a source of power connected to said power control means for providing power to said heating means when said power control means is actuated;
temperature monitoring means associated with said article being heated for measuring the temperature of said article, said temperature monitoring means being approximately 0.03 to 0.375 inch radially outward from an outer surface of its respective heating means; and
computer means operatively connected to said light signal generating means and said temperature monitoring means for providing commands to said light signal generating means in the form of a train of equidistantly spaced electrical pulses in response to a temperature measurement provided by said monitoring means.

24. The heating system of claim 23, wherein said light signal generating means comprises a light emitting diode.

25. The heating system of claim 23, wherein said power control means comprises a photosensitive transistor.

26. The heating system of claim 23, wherein said temperature monitoring means comprises a thermocouple.

27. The heating system of claim 23, wherein said computer means causes a series of pulses to be fed to said light generating means, whereby said power is passed to said heating means in a series of pulses.

28. The heating system of claim 23, wherein said temperature monitoring means comprises a thermocouple disposed adjacent said heated article.

29. The heating system of claim 28, wherein said computer means interrogates said thermocouple incrementally.

30. The heating system of claim 29, wherein said thermocouple has a plurality of outputs and said incremental interrogation comprises scanning all of said thermocouple outputs approximately at least once every 2.4 seconds.

31. The heating system of claim 23, wherein said computing means calculates a duty cycle of pulsed commands provided to said light signal generating means in response to a measurement of said temperature monitoring means.

32. The heating system of claim 23, wherein said train of equidistantly spaced electrical pulses range from at least zero to 100 pulses per 100 milliseconds.

33. A computerized temperature control system, comprising
a computer for calculating a heat cycle and issuing a series of command signals to a power supply in the form of equidistantly spaced electrical pulses in a response to an incremental temperature measurement;
a plurality of heating elements for heating an article at an elevated temperature;
a power supply operatively connected to said heating elements for supplying a series of power pulses thereto in response to said computer commands;
isolation means electrically isolating said computer from said power supply; and
temperature monitoring means operatively connected to said computer and disposed adjacent to said article for obtaining temperature measurements from said heated article, said computer operative to incrementally interrogate said temperature monitoring means, and in response to a temperature measurement signal, calculate a duty cycle comprising a series of command pulses for actuating said power supply, said temperature monitoring means being approximately 0.03 to 0.375 inch radially outward from an outer surface of its respective heating element.

34. The computerized temperature control system of claim 33, wherein said temperature monitoring means comprises a plurality of thermocouples whose respective response times are less than the time said computer takes to incrementally interrogate said thermocouples.

35. The computerized temperature control system of claim 33, wherein said isolation means comprises light generating means operatively connected to said computer and in response to said computer commands providing a series of light pulses, and a plurality of light-sensitive switching means, each operatively disposed between said power supply and a corresponding one of said heating elements for passing power to said heating elements in response to said light pulses.

36. The computerized temperature control system of claim 35, wherein each of said switching means comprises a phototransistor.

37. The computerized temperature control system of claim 35, wherein said light generating means comprises a plurality of light-emitting diodes, each associated with a respective one of said switching means.

38. The computerized temperature control system of claim 33, wherein said uniformly spaced electrical pulses range from at least zero to 100 pulses per 100 milliseconds.

39. A temperature control system for heating an article at an elevated steady state temperature and controlling said steady state temperature within precise, given limits, said temperature control system comprising heating means for receiving power to heat an article, said heating means comprising a substantially cylindrical hollow muffle formed of alumina ceramic in which the article to be heated is disposed, a number of heat generating windings wound upon the muffle, whose internal diameter is in a range between 0.5 to 10.0 inches, and whose thickness is approximately between 0.060 and 0.500 inch, said windings being helically wound on said muffle and thermally coupled to said muffle to provide a quick heating response to power received by said heating means, each of said windings defining a respective heating zone of a heating profile;

light-actuated power control means connected to said heating means for passing power to said heating means in response to a light signal;

light signal generating means for generating a light signal to actuated said power control means;

a source of power connected to said power control means for providing power to said heating means when said power control means is actuated;

temperature monitoring means associated with said article being heated for measuring the temperature of said article, said temperature monitoring means comprising a plurality of thermocouples, at least one theremocouple for each said heating zone, each of said thermocouples being disposed approximately in a mid-portion of the length its respective winding and being approximately 0.03 to 0.375 inch radially outward from an outer surface of its respective winding;

computer means operatively connected to said light signal generating means and said temperature monitoring means for providing commands to said light signal generating means in the form of a train of equidistantly spaced electrical pulses ranging from at least zero to 100 pulses per 100 milliseconds, in response to a temperature measurement provided by said monitoring means; and amplifying and digitizing means for amplifying and digitizing the output of each of said thermocouples prior to transmittal to said computer means.

40. The temperature control system of claim 39, wherein each of said thermocouples has leads encased in segmented ceramic tubing to provide flexibility for thermal expansion of said muffle.

41. A computerized temperature control system comprising a computer for calculating a heat cycle and issuing a series of command signals to a power supply in the form of equidistantly spaced electrical pulses ranging from at least zero to 100 pulses per 100 milliseconds in response to an incremental temperature measurement;

a substantially cylindrical hollow muffle formed of alumina ceramic in which an article to be heated is disposed, said muffle having an internal diameter in a range of 0.5 to 10 inches and a thickness of approximately 0.060 and 0.500 inch;

a plurality of heating windings for heating an article at an elevated temperature, said heating windings being wound on said muffle, each winding defining a heating zone, and a number of zones forming a heating profile for said article being heated, said windings being thermally coupled to said muffle to provide a quick heating response to power received by said heating windings;

a power supply operatively connected to said heating windings for supplying a series of power pulses thereto is response to command signals from said computer;

isolation means for electrically isolating said computer from said power supply; and temperature monitoring means operatively connected to said computer and disposed adjacent said article for obtaining temperature measurements from said heated article, said computer being operative to incrementally interrogate said temperature monitoring means, and in response to a temperature measurement signal, calculate a duty cycle comprising a series of command pulses for actuating said power supply, said temperature monitoring means comprising a plurality of thermocouples, at least one thermocouple for each said heating zone, each of said thermocouples being disposed approximately in a mid-portion of the length of its respective winding and being approximately 0.03 to 0.375 inch radially outward from an outer surface of its respective winding; and amplifying and digitizing means for amplifying and digitizing the output of each of said thermocouples prior to transmittal to said computer means.

42. The computerized temperature control system of claim 40, wherein each of said thermocouples has leads encased in segmented ceramic tubing to provide flexibility for thermal expansion of said muffle.

* * * * *